(12) United States Patent
Nishi

(10) Patent No.: US 9,305,788 B2
(45) Date of Patent: Apr. 5, 2016

(54) METHOD OF FABRICATING SEMICONDUCTOR DEVICE

(71) Applicant: Sumitomo Electric Device Innovations, Inc., Yokohama (JP)

(72) Inventor: Masahiro Nishi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/066,436

(22) Filed: Oct. 29, 2013

(65) Prior Publication Data

US 2014/0120718 A1  May 1, 2014

(30) Foreign Application Priority Data

Oct. 29, 2012 (JP) ................................. 2012-237440
Oct. 29, 2012 (JP) ................................. 2012-237446

(51) Int. Cl.
| H01L 21/285 | (2006.01) |
| H01L 21/768 | (2006.01) |
| H01L 23/532 | (2006.01) |
| H01L 29/66 | (2006.01) |
| H01L 29/20 | (2006.01) |

(52) U.S. Cl.
CPC ........ *H01L 21/28575* (2013.01); *H01L 21/768* (2013.01); *H01L 21/76841* (2013.01); *H01L 21/76843* (2013.01); *H01L 23/53219* (2013.01); *H01L 29/66462* (2013.01); *H01L 29/2003* (2013.01)

(58) Field of Classification Search
CPC ............ H01L 21/768; H01L 21/76841; H01L 21/76843; H01L 23/5323; H01L 23/53219; H01L 21/08575; H01L 29/66462; H01L 29/2003
USPC ......................................... 438/571, 586, 688
See application file for complete search history.

(56) References Cited

U.S. PATENT DOCUMENTS

| 5,929,467 A | 7/1999 | Kawai et al. |
| 7,550,784 B2 * | 6/2009 | Saxler et al. ................. 257/194 |

FOREIGN PATENT DOCUMENTS

JP  10-223901  8/1998

* cited by examiner

*Primary Examiner* — Thanhha Pham
(74) *Attorney, Agent, or Firm* — Venable LLP; Michael A. Sartori; Trent B. Ostler

(57) ABSTRACT

A method of fabricating a semiconductor device includes: forming a metal layer containing Al; forming an insulating film on the metal layer; forming an opening pattern to the insulating film, the metal layer being exposed in the opening pattern; and forming a wiring layer in the opening pattern, a first portion being disposed between an edge of the wiring layer and an edge of the opening pattern, a width of the first portion being 1 µm or less, and the metal layer being exposed in the first portion.

15 Claims, 11 Drawing Sheets

METHOD OF FABRICATING SEMICONDUCTOR DEVICE

CROSS-REFERENCE TO RELATED APPLICATION

This application is based upon and claims the benefit of priority of the prior Japanese Patent Application No. 2012-237440 filed on Oct. 29, 2012 and the prior Japanese Patent Application No. 2012-237446 filed on Oct. 29, 2012, the entire contents of which are incorporated herein by reference.

BACKGROUND (i) Technical Field

The present invention relates to a method of fabricating a semiconductor device.

(ii) Related Art

An FET (Field Effect Transistor) such as a HEMT (High Electron Mobility Transistor) using a nitride semiconductor has attracted attentions as an amplifier that operates at high frequency and high output such as an amplifier for a portable telephone base station. An Al (aluminum) film has been used for an ohmic electrode of the FET using the nitride semiconductor as disclosed in Japanese Patent Application Publication No. 10-223901.

However, a hillock is formed in the Al film of the ohmic electrode because of heat treatment. When the hillock comes close to or makes contact with a metal layer other than the ohmic electrode, the pressure resistance decreases or the reliability decreases.

SUMMARY

It is an object to provide a method of fabricating a semiconductor device that is capable of reducing hillock formation in an ohmic electrode.

According to an aspect of the present invention, there is provided a method of fabricating a semiconductor device, the method including: forming a metal layer containing Al; forming an insulating film on the metal layer; forming an opening pattern to the insulating film, the metal layer being exposed in the opening pattern; and forming a wiring layer in the opening pattern, a first portion being disposed between an edge of the wiring layer and an edge of the opening pattern, a width of the first portion being 1 µm or less and the metal layer being exposed in the first portion.

According to another aspect of the present invention, there is provided a method of fabricating a semiconductor device, the method including: forming a metal layer containing Al; forming an insulating film on the metal layer; forming an opening pattern to the insulating film, the metal layer being exposed in the opening pattern; forming a wiring layer including a pattern that exposes the metal layer inside the opening pattern of the insulating film, a second portion being disposed between an edge of the wiring layer and an edge of the opening pattern, and a width of the second portion being 1 µm or more; and forming a protective layer that covers surfaces of the wiring layer and the exposed metal layer and includes a pattern that exposes the metal layer, a third portion being disposed between an edge of the protective layer and an edge of the opening pattern, a width of the third portion being 1 µm or less, and the metal layer being exposed in the third portion.

According to another aspect of the present invention, there is provided a method of fabricating a semiconductor device, the method including: forming an electrode pattern including a metal layer containing Al adjacent to a gate electrode; forming an insulating film on the electrode pattern; forming a resist layer having an opening formed on the electrode pattern on an upper surface including a region between the gate electrode and the electrode pattern; forming an opening pattern of the insulating film that exposes the metal layer by removing the insulating film inside the opening of the resist layer; forming a layer made of a metal on the exposed metal layer and the resist layer; forming a wiring layer including a pattern that exposes the metal layer from an edge portion of the opening pattern inside the opening pattern by patterning the layer made of a metal; and removing the resist layer.

DETAILED DESCRIPTION

Hereinafter, a description will be given of an embodiment with reference to the drawings.

[First Embodiment]

Figure 1A:
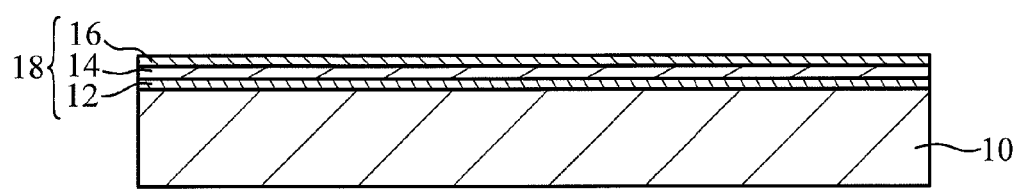
FIG. 1A through FIG. 1C are cross-sectional views illustrating a method of fabricating a semiconductor device in accordance with a first embodiment (No. 1)

FIG. 1A through FIG. 3B are cross-sectional views illustrating a method of fabricating a semiconductor device in accordance with a first embodiment. As illustrated in FIG. 1A, prepared is a substrate 10 having a nitride semiconductor layer 18 formed on the upper surface thereof. The substrate 10 is, for example, a SiC substrate, a Si substrate, or a sapphire substrate. The nitride semiconductor layer 18 includes a channel layer 12, an electron supply layer 14, and a cap layer 16 in this order from the substrate 10 side. The channel layer 12 is, for example, an undoped GaN layer with a film thickness of 1000 nm, the electron supply layer 14 is, for example, an AlGaN layer with a film thickness of 20 nm, and the cap layer 16 is, for example, an n-type GaN layer with a film thickness of 5 nm. An AlN layer may be formed between the substrate 10 and the channel layer 12 as a buffer layer.

Figure 1B:
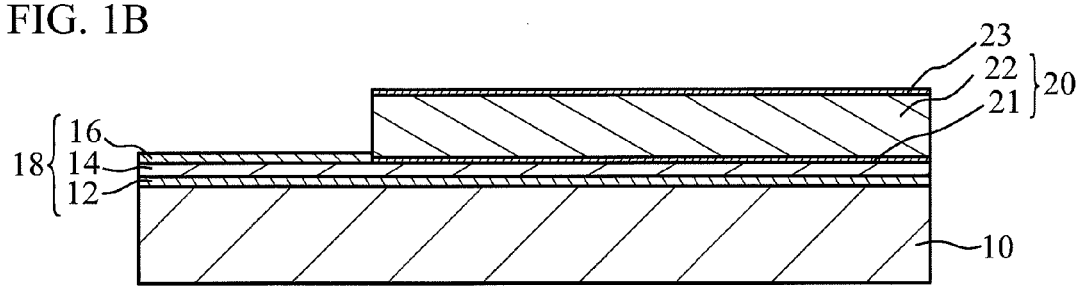

Then, an ohmic electrode 20 is formed on a surface of the nitride semiconductor layer 18 as illustrated in FIG. 1B. In FIG. 1B, the ohmic electrode 20 is formed in contact with the electron supply layer 14, but may be formed in contact with the cap layer 16. The ohmic electrode 20 is formed by, for example, evaporation and liftoff. The ohmic electrode 20 may be formed by sputtering. The ohmic electrode 20 includes a Ta (tantalum) film 21 formed in contact with the nitride semiconductor layer 18 and an Al film 22 formed on the Ta film 21. A metal film 23 is formed on the Al film 22. The metal film 23 is a film to reduce hillock formation in the Al film 22, and is, for example, a Ta film. The Ta film 21, the Al film 22, and the metal film 23 have film thicknesses of, for example, 10 nm, 280 nm, and 10 nm, respectively. The Al film 22 is preferably the thickest film in the ohmic electrode 20. The ohmic electrode 20 and the nitride semiconductor layer 18 are heat treated at a temperature greater than or equal to 500° C. to be alloyed. For example the heat treatment is performed at a temperature of 550° C. In addition, the heat treatment is performed at a temperature greater than or equal to 500° C. and less than or equal to 800° C., for example. The metal film 23 is formed on the Al film 22, and thus hillock formation in the Al film 22 due to the heat treatment can be reduced.

Figure 1C:
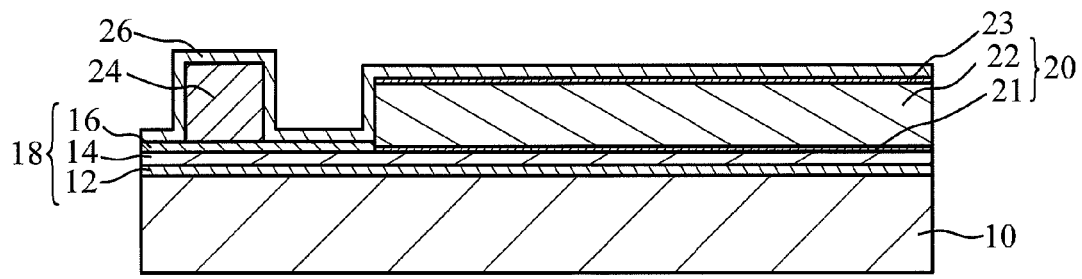

Then, a gate electrode 24 is formed on the nitride semiconductor layer 18 as illustrated in FIG. 1C. The gate electrode 24 is formed by, for example, evaporation and liftoff. The gate electrode 24 may be formed by sputtering. The gate electrode 24 includes a Ni (nickel) film and an Au (gold) film in this order from the nitride semiconductor layer 18 side. An insulating film 26 (first insulating film) is formed on the nitride semiconductor layer 18 so as to cover the ohmic electrode 20 and the gate electrode 24. The insulating film 26 is formed by, for example, plasma CVD (Chemical Vapor Deposition). The insulating film 26 is, for example, a silicon nitride film with a film thickness of 50 nm, and is, for example, a low stress film with a stress less than or equal to $1 \times 10^9$ dyne/cm$^2$.

Figure 2A:
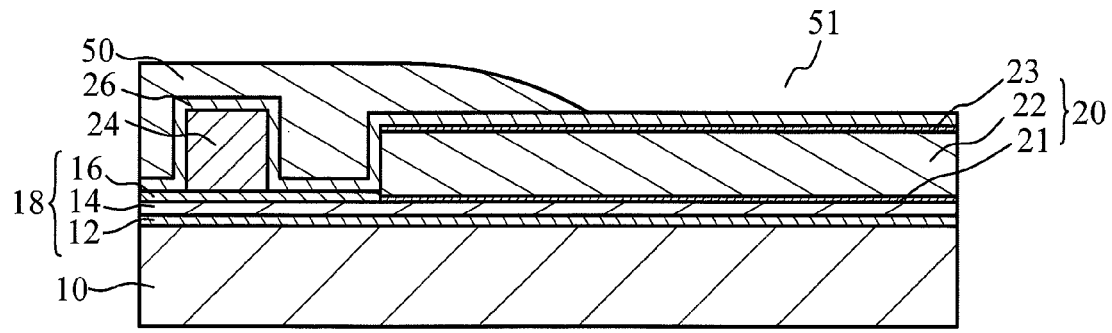
FIG. 2A through FIG. 2C are cross-sectional views illustrating the method of fabricating the semiconductor device of the first embodiment (No. 2)

Then, a photoresist 50 having an opening 51 is formed as illustrated in FIG. 2A. The opening 51 is formed on the ohmic electrode 20. The photoresist 50 is hardened by heat treatment to withstand stress and heat applied when a barrier layer 31 and a seed layer 32 are formed (see FIG. 2C). This heat treatment makes the edge portion of the photoresist 50 curved.

Figure 2B:
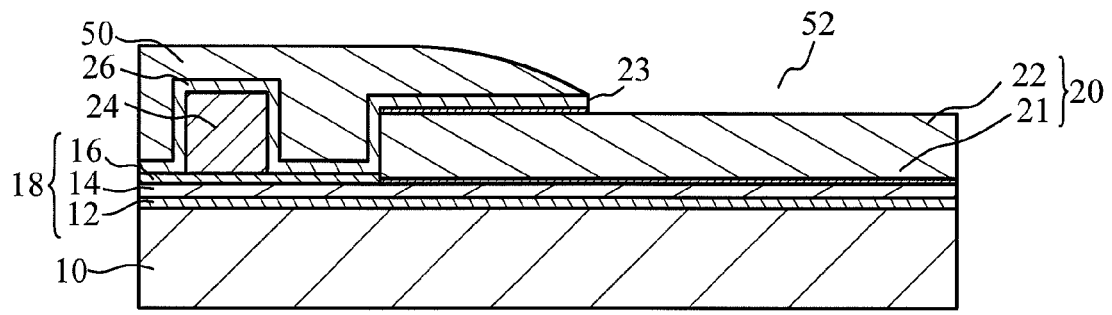

Then, the insulating film 26 is removed by using the photoresist 50 as a mask as illustrated in FIG. 2B. This process forms an opening 52 in the insulating film 26 on the ohmic electrode 20. That is to say, the opening 52 to which the ohmic electrode 20 is exposed is formed in the insulating film 26. The insulating film 26 is removed by, for example, dry etching using a fluorine-based gas such as SF$_6$ as an etching gas. At this point, the opening 52 is also formed in the metal film 23.

Figure 2C:
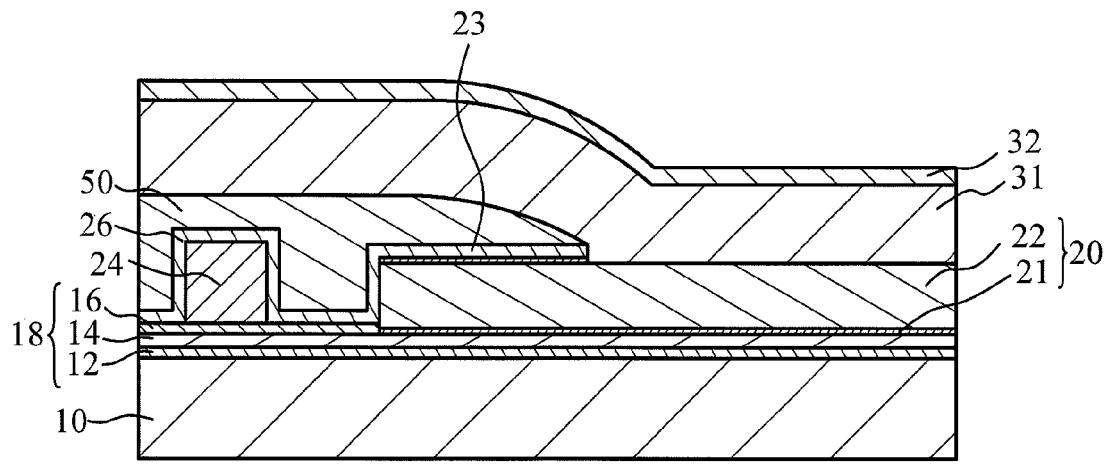

Then, the barrier layer 31 and the seed layer 32 are formed on the ohmic electrode 20 and the photoresist 50 in the opening 52 as illustrated in FIG. 2C. The barrier layer 31 and the seed layer 32 are formed by, for example, sputtering. The barrier layer 31 is, for example, a TiWN (titanium.tungsten. .nitride) film. The seed layer 32 is an Au film. The barrier layer 31 is a layer to prevent the reaction between the ohmic electrode 20 and a plated layer 34 (see FIG. 3A). For example, when the plated layer 34 and the seed layer 32 are Au films, the barrier layer 31 prevents the eutectic reaction between Au and Al of the ohmic electrode 20. The seed layer 32 is a layer for supplying the electrical power in electrolytic plating.

Figure 3A:
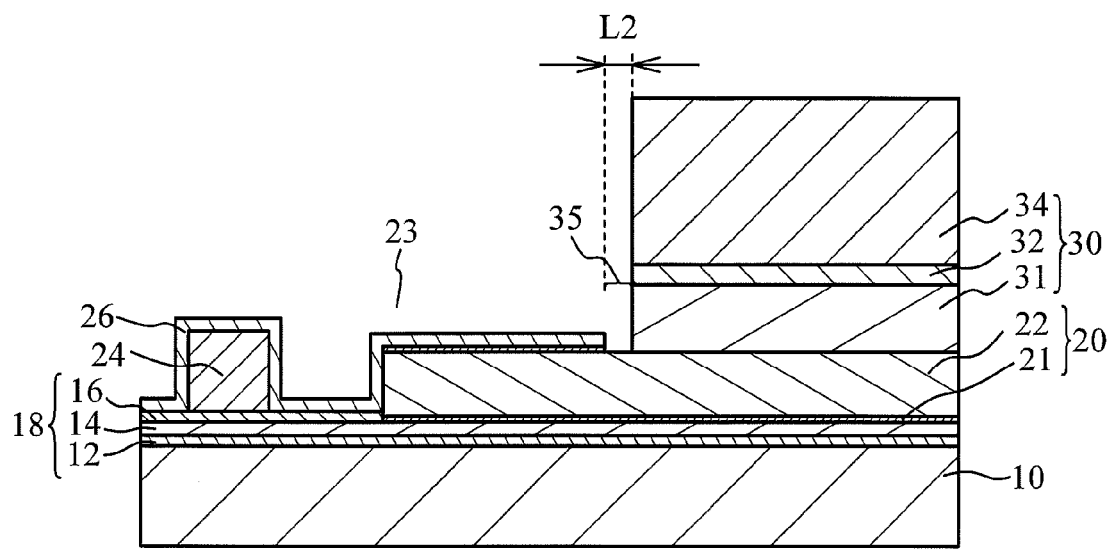
FIG. 3A and FIG. 3B are cross-sectional views illustrating the method of fabricating the semiconductor device of the first embodiment (No. 3)

Then, the plated layer 34 is formed by, for example, electrolytic plating by using a photoresist as a mask (not illustrated) as illustrated in FIG. 3A. The aforementioned mask has a smaller opening than the mask of the photoresist 50 has. The plated layer 34 is, for example, an Au layer with a film thickness of 1 μm to 5 μm. The seed layer 32 and the barrier layer 31 are removed by using the plated layer 34 as a mask. Then, the photoresist 50 is removed. This process forms a wiring layer 30 from the plated layer 34, the seed layer 32, and the barrier layer 31. The wiring layer 30 may be formed by evaporation and liftoff. The wiring layer 30 is coupled to the ohmic electrode 20 through the opening 52 of the insulating film 26. That is to say, the wiring layer 30 coupled to the ohmic electrode 20 is formed in the opening 52. The ohmic electrode 20 is exposed in a region 35 in which the wiring layer 30 is located away from the insulating film 26. A distance L2 between the wiring layer 30 and the insulating film 26 is less than or equal to 1 μm. When the wiring layer 30 overlaps with the insulating film 26 in FIG. 2C, a space is formed under the barrier layer 31 when the photoresist 50 is removed in FIG. 3A, and thus the coatability of an insulating film 36 (see FIG. 3B) decreases and the moisture resistance decreases. To form the wiring layer 30 not to overlap with the insulating film 26, the wiring layer 30 is preferably located away from the insulating film 26 in consideration of an overlapping margin.

Figure 3B:
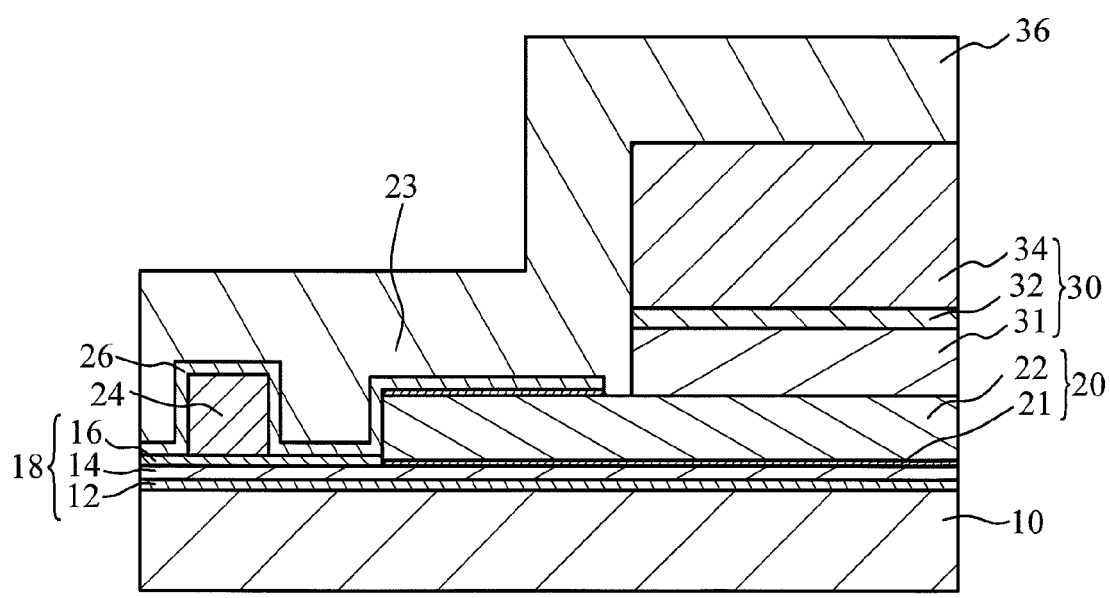

Then, the insulating film 36 (second insulating film) is formed so as to cover the wiring layer 30 as illustrated in FIG. 3B. The insulating film 36 is formed by, for example, plasma CVD. The insulating film 36 is, for example, a silicon nitride film with a film thickness of 500 nm. The insulating film 26 is preferably a dense film to improve the moisture resistance. Thus, the insulating film 26 has a compression stress of approximately $5 \times 10^9$ dyne/cm$^2$ for example. The growth temperature of the insulating film 26 is, for example, 300° C.

In the first embodiment, the distance L2 between the wiring layer 30 and the insulating film 26 is less than or equal to 1 μm, and hillock formation in the ohmic electrode 20 can be therefore reduced. The distance L2 may be 0 μm. That is to say, the wiring layer 30 may make contact with the insulating film 26. In addition, the present invention can also reduce hillock formation by forming the wiring layer 30 as illustrated in FIG. 4A and FIG. 4B after FIG. 2C, and further forming a metal film on the ohmic electrode 20.

Figure 4A:
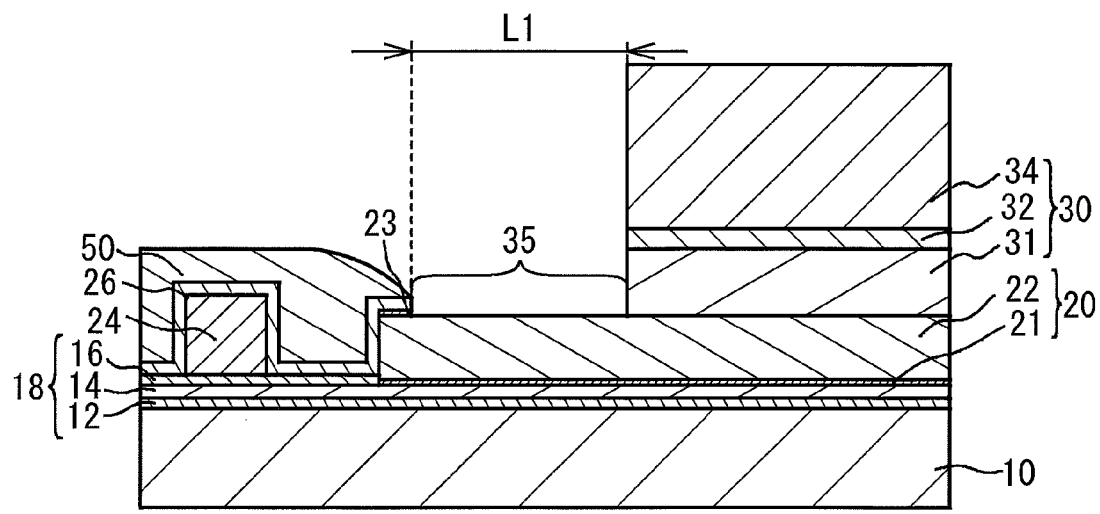
FIG. 4A and FIG. 4B are cross-sectional views illustrating a method of fabricating a semiconductor device of an embodiment (No. 1)

The plated layer 34 is formed by, for example, electrolytic plating by using a photoresist as a mask (not illustrated) as illustrated in FIG. 4A. The plated layer 34 is, for example, an Au layer with a film thickness of 1 μm to 5 μm. The seed layer 32 and the barrier layer 31 are removed by using the plated layer 34 as a mask. This process forms the wiring layer 30 from the plated layer 34, the seed layer 32, and the barrier layer 31. The wiring layer 30 may be formed by evaporation and liftoff. The wiring layer 30 is coupled to the ohmic electrode 20 through the opening 52 of the insulating film 26. That is to say, the wiring layer 30 coupled to the ohmic electrode 20 is formed in the opening 52. The ohmic electrode 20 is exposed in the region 35 in which the wiring layer 30 is located away from the insulating film 26. A distance L1 between the wiring layer 30 and the insulating film 26 is greater than 1 μm. When the wiring layer 30 overlaps with the insulating film 26, the coatability of the insulating film 36 (see FIG. 6B) decreases and the moisture resistance decreases. To form the wiring layer 30 not to overlap with the insulating film 26, the wiring layer 30 is preferably located away from the insulating film 26 in consideration of an overlapping margin.

Figure 4B:
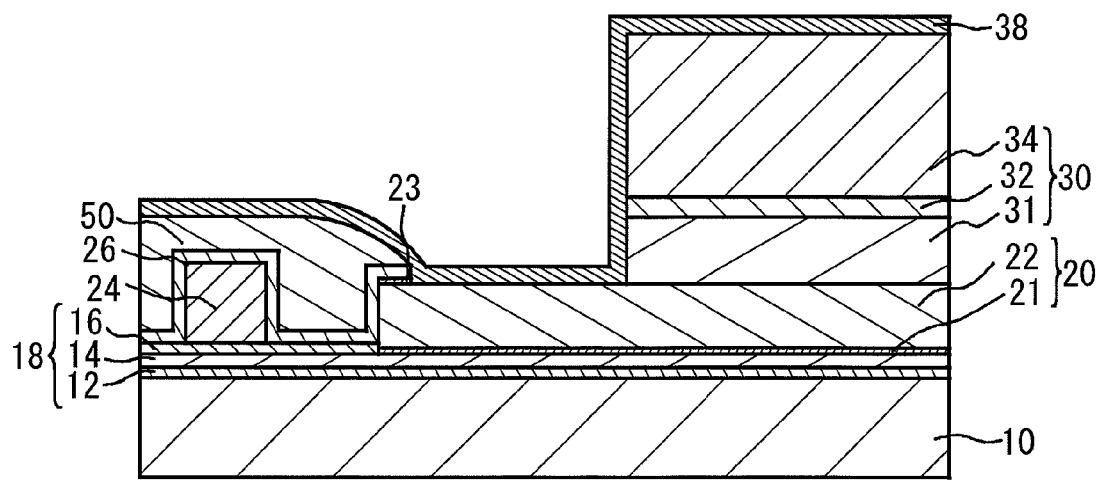

Then, a metal film 38 is formed so as to cover the wiring layer 30 as illustrated in FIG. 4B. The metal film 38 is formed by, for example, sputtering. The metal film 38 is a film to reduce hillock formation in the Al film 22, and is, for example, a Ta film with a film thickness greater than or equal to 10 nm. The metal film 38 may be formed by evaporation and liftoff.

Figure 5:
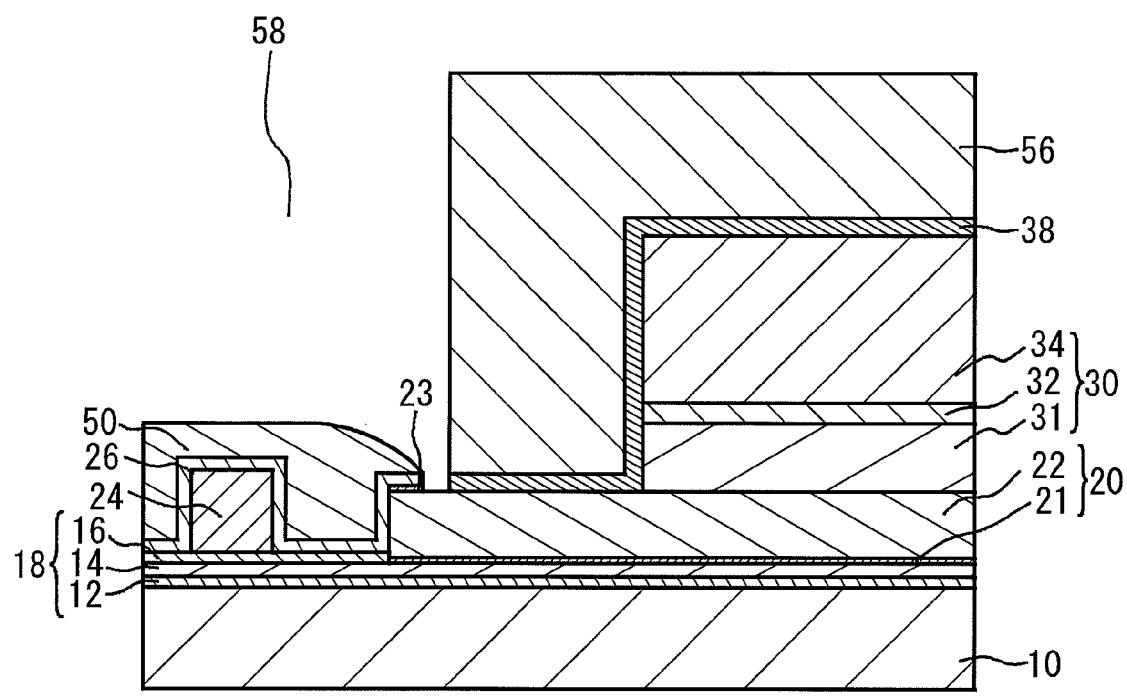
FIG. 5 is a cross-sectional view illustrating the method of fabricating the semiconductor device of the embodiment (No. 2)

As illustrated in FIG. 5, a photoresist 56 having an opening 58 is formed on the metal film 38. The metal film 38 is removed by using the photoresist 56 as a mask. The metal film 38 is removed by dry etching using a fluorine-based gas such as $SF_6$ as an etching gas.

Figure 6A:
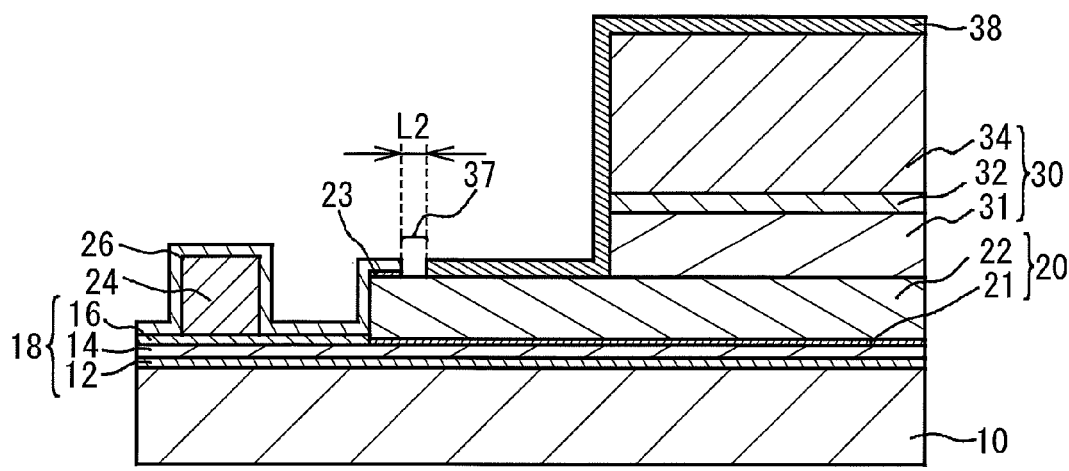
FIG. 6A and FIG. 6B are cross-sectional views illustrating the method of fabricating the semiconductor device of the embodiment (No. 3)
Figure 6B:
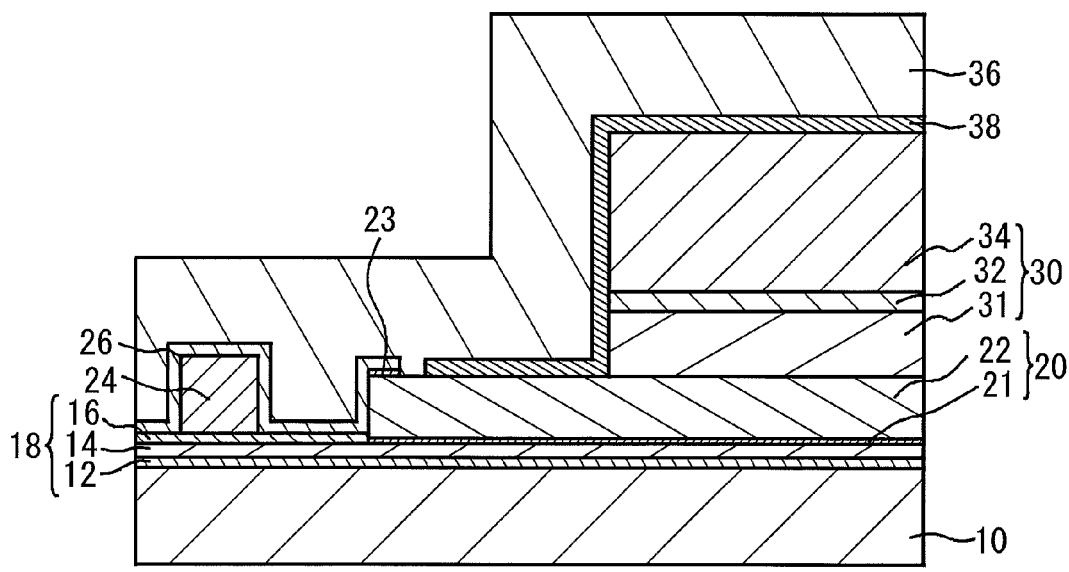

As illustrated in FIG. 6A, the photoresist 56 is exfoliated. This process causes the upper surface of the ohmic electrode 20 to be exposed to a region 37 between the metal film 38 and the insulating film 26. The distance L2 of the region 37 is less than or equal to 1 μm. As illustrated in FIG. 6B, the insulating film 36 (second insulating film) is formed so as to cover the wiring layer 30. The insulating film 36 is formed by, for example, plasma CVD. The insulating film 36 is, for example, a silicon nitride film with a film thickness of 500 nm. The insulating film 26 is preferably a dense film to improve the moisture resistance. Thus, the insulating film 26 has a compression stress of approximately $5 \times 10^9$ dyne/cm$^2$ for example. The growth temperature of the insulating film 26 is, for example, 300° C.

In the embodiment, the distance L2 between the metal film 38 and the insulating film 26 is less than or equal to 1 μm, and thus the hillock formation in the ohmic electrode 20 can be reduced. The distance L2 may be 0 μm. That is to say, the wiring layer 30 may make contact with the insulating film 26. In addition, when the metal film 38 is formed by evaporation and liftoff, the metal film 38 may overlap with the insulating film 26.

Figure 7A:
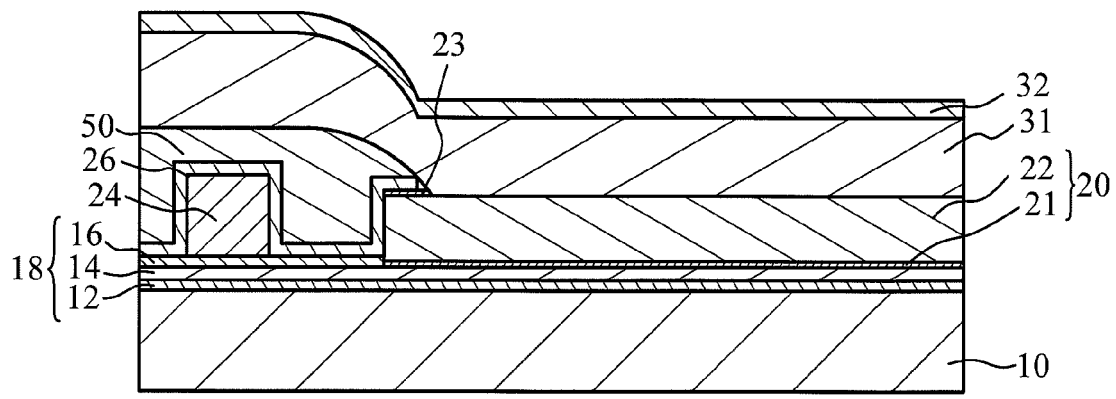
FIG. 7A and FIG. 7B are diagrams illustrating a method of fabricating a semiconductor device in accordance with a first comparative example (No. 1)
Figure 7B:
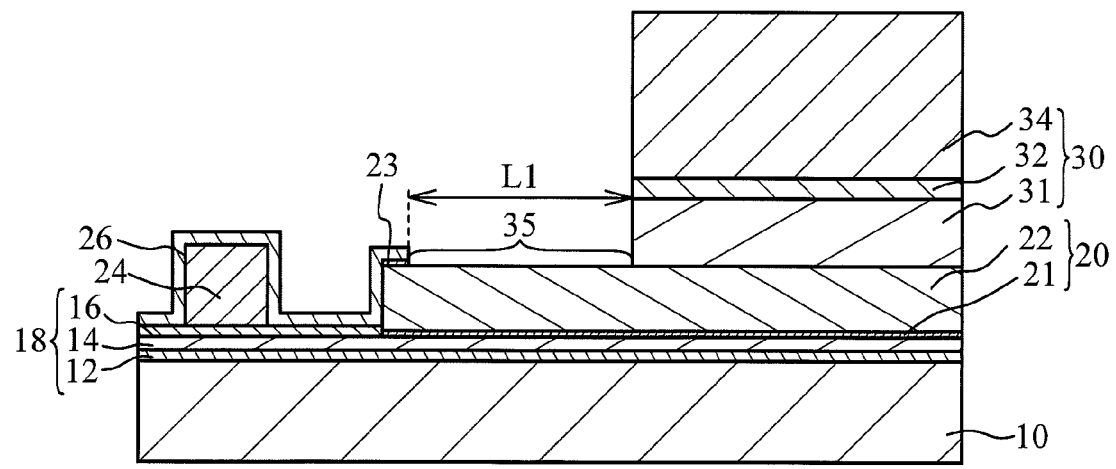
Figure 8:
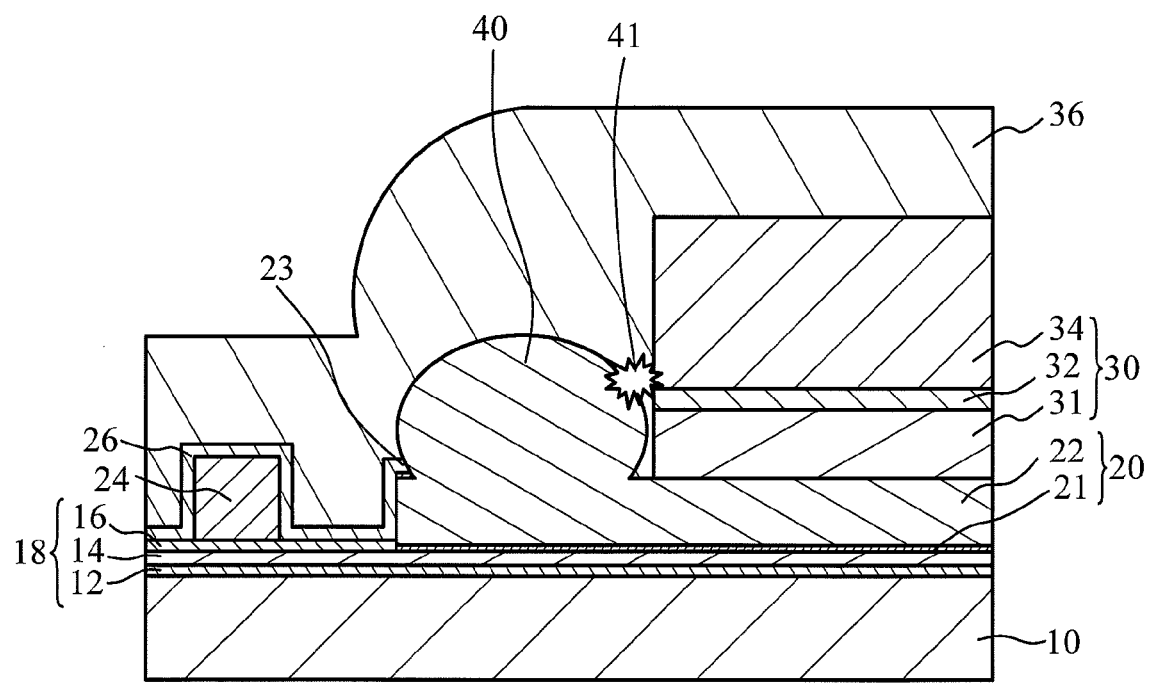
FIG. 8 is a diagram illustrating the method of fabricating the semiconductor device of the first comparative example (No. 2)

A description will now be given of a first comparative example to explain the advantage of the first embodiment. FIG. 7A through FIG. 8 are diagrams illustrating a method of fabricating a semiconductor device in accordance with the first comparative example. As illustrated in FIG. 7A, the processes described in FIG. 1A to FIG. 2C of the first embodiment are performed. The photoresist 50 is formed so as to overlap with the ohmic electrode 20 less than that of the first embodiment. That is to say, the photoresist 50 is formed so as to overlap with the edge portion of the ohmic electrode 20 less than that of the first embodiment. Then, the wiring layer 30 is formed by the same process illustrated in FIG. 3A of the first embodiment as illustrated in FIG. 7B. The distance L1 of the region 35 is made to be greater than 1 pm. Then, the insulating film 36 covering the wiring layer 30 is formed in the same manner as FIG. 3B of the first embodiment as illustrated in FIG. 8.

In the first comparative example, a hillock 40 due to the Al film 22 of the ohmic electrode 20 is formed in the region 35. The size of the hillock 40 is greater than or equal to 1 μm. When the hillock 40 comes close to or makes contact with the plated layer 34, the plated layer 34 reacts with the hillock 40. For example, when the plated layer 34 includes Au, the eutectic reaction between Au and Al occurs (see a region 41 of FIG. 8). In addition, when the hillock 40 comes close to or makes contact with the gate electrode 24, the pressure resistance between the gate electrode 24 and the ohmic electrode 20 decreases. This causes failure.

Figure 9A:
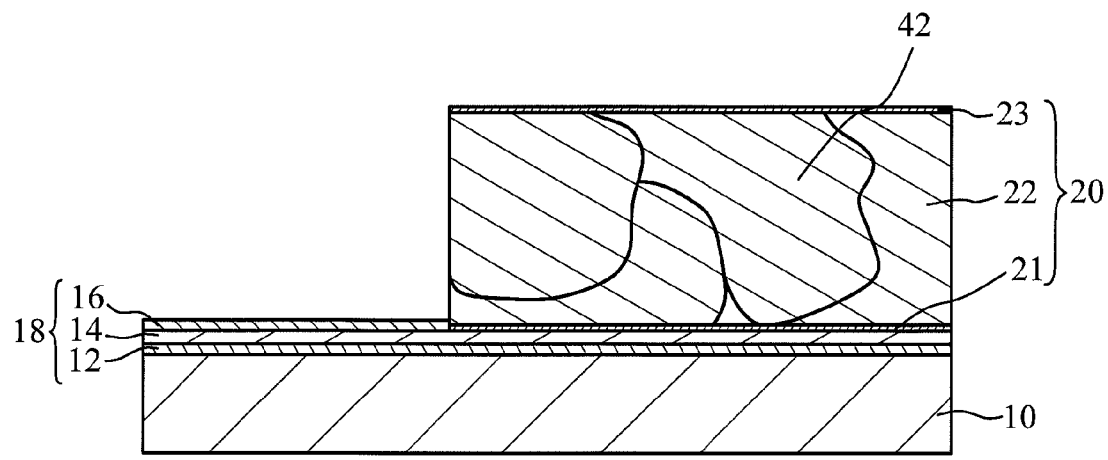
FIG. 9A and FIG. 9B are diagrams for explaining the reduction of hillock formation (No. 1)

Using the first embodiment, a description will now be given of a reason why the formation of the hillock 40 is reduced. The explanation using the embodiment that uses the metal film 38 is omitted because the principle is the same as the first embodiment. FIG. 9A through FIG. 10 are diagrams for explaining the reduction of hillock formation. As illustrated in FIG. 9A, the ohmic electrode 20 is formed as illustrated in FIG. 1B, and then heat-treated to be alloyed with the nitride semiconductor layer 18. The heat treatment for alloying is performed at a temperature greater than or equal to 500° C. and less than or equal to 800° C. A grain 42 is formed in the Al film 22. The size of the grain 42 depends on the heat treatment temperature. The grain 42 becomes large when the temperature is high while the grain 42 becomes small when the temperature is low. The grain 42 becomes greater than or equal to 1 μm when the heat treatment is performed at a temperature greater than or equal to 500° C.

Figure 9B:
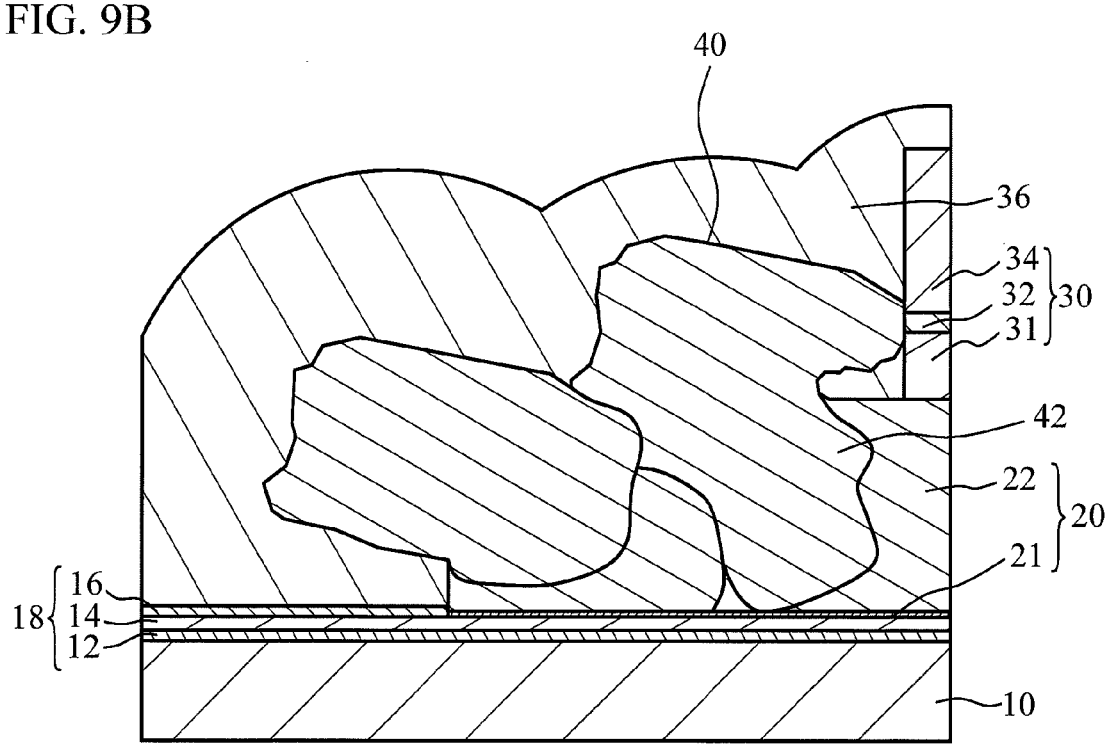
Figure 10:
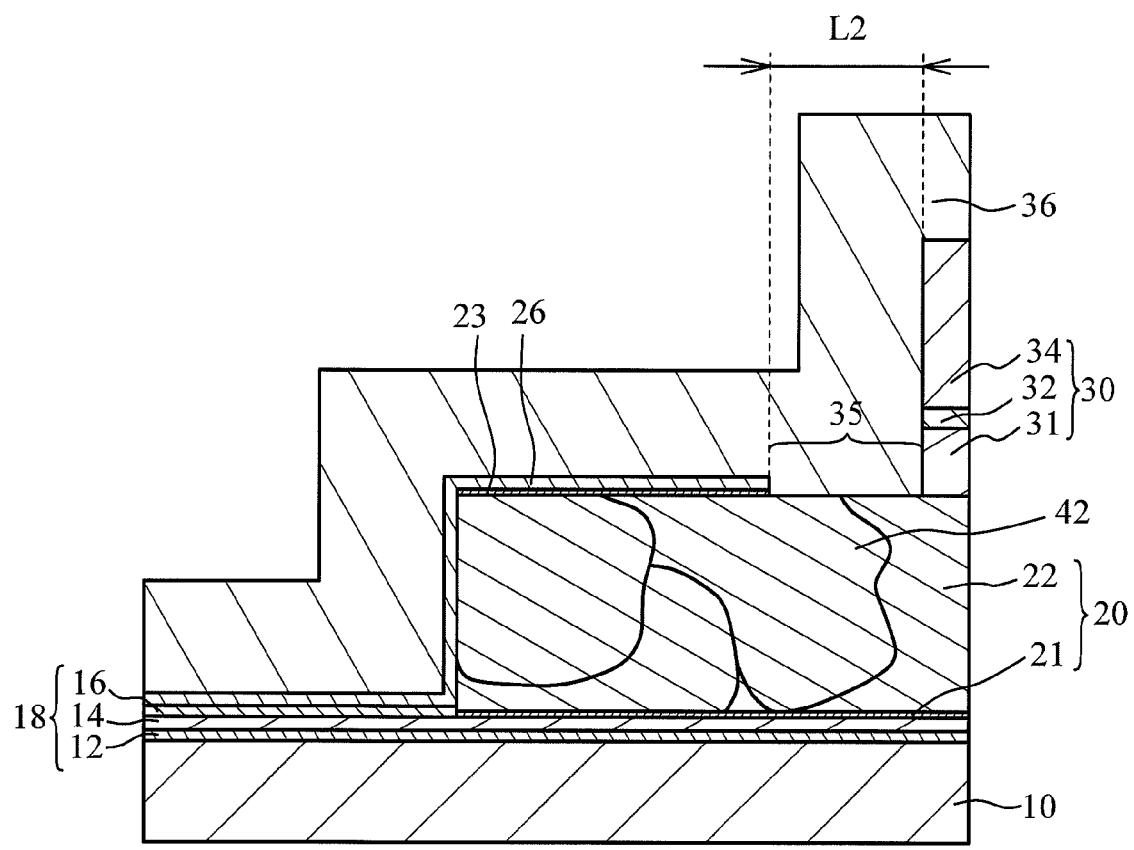
FIG. 10 is a diagram for explaining the reduction of hillock formation (No. 2)

As illustrated in FIG. 9B, when the insulating film 36 is formed while the Al film 22 is exposed, heat and/or the stress of the insulating film 36 forms the hillock 40 and/or a void. The hillock 40 is formed by the heat treatment at a temperature greater than or equal to 250° C. Examples of the heat treatment at a temperature greater than or equal to 250° C. include the heat treatment performed in forming of the insulating film 36 and a wafer bake process in photolithography (drying process after a water washing process). Or, the hillock 40 is formed by the compression or tensile stress of the insulating film 36. For example, the hillock 40 is formed by a compression stress or a tensile stress greater than or equal to $5 \times 10^9$ dyne/cm$^2$. In addition, when the insulating film 36 is formed by a compression stress or a tensile stress greater than $5 \times 10^{10}$ dyne/cm$^2$, the insulating film 36 exfoliates and/or a crack is formed in the insulating film 36. Therefore, the stress of the insulating film 36 is preferably less than or equal to $5 \times 10^{10}$ dyne/cm$^2$.

As illustrated in FIG. 10, the width of the region 35 to which the Al film 22 is exposed from the insulating film 26, i.e. the distance L2 between the edge portion of the insulating film 26 and the edge portion of the wiring layer 30 is set to less than or equal to 1 μm. As described above, the width of the region 35 is made to be less than the size of the grain 42 of Al. This reduces the formation of the hillock 40.

The following experiment was conducted to examine whether narrowing the width of the region to which the Al film 22 is exposed reduces the formation of the hillock 40. On the substrate 10, formed are the Ta film 21 with a film thickness of 10 nm, the Al film 22 with a film thickness of 280 nm, and a Ta film with a film thickness of 10 nm. The heat treatment is performed at a temperature of 500° C. A TiW film with a film thickness of 200 nm is formed on the center portion of the Al film 22. The TiW film is a film to reduce hillock formation in the Al film 22. A silicon nitride film with a film thickness of 500 nm is formed by plasma CVD. The growth temperature of the silicon nitride film is 300° C. The silicon nitride film has a compression stress of approximately $5 \times 10^9$ dyne/cm$^2$. The formation of the hillock in the Al film 22 is observed with a microscope.

The presence or absence of the hillock formed in the Al film 22 was examined by changing the width of the region to which the Al film 22 is exposed between the edge portion of the Al film 22 and the edge portion of the TiW film. Hillocks were formed in samples in which the width of the exposed region of the Al film 22 is 1.62 μm and 1.30 μm. On the other hand, hillocks were not formed in samples in which the width of the exposed region is 0.94 μm, 0.70 μm, 0.52 μm, 0.40 μm, and 0.11 μm. Therefore, hillock formation in the Al film 22 can be reduced by configuring the width of the exposed region of the Al film 22 to be less than or equal to 1 μm.

Figure 11:
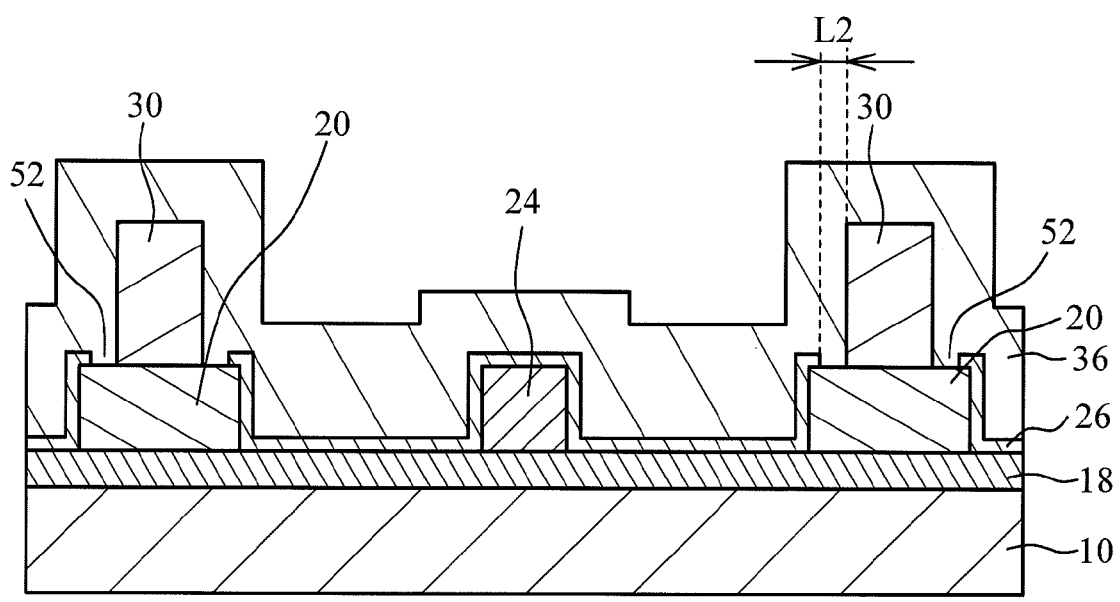
FIG. 11 is a cross-sectional view of the semiconductor device of the first embodiment.

FIG. 11 is a cross-sectional view of the semiconductor device of the first embodiment. As illustrated in FIG. 11, the nitride semiconductor layer 18 is formed on the substrate 10. A source electrode and a drain electrode are formed on the nitride semiconductor layer 18 as the ohmic electrode 20. Although not illustrated, the ohmic electrode 20 is formed in contact with the electron supply layer 14 of the nitride semiconductor layer 18. The gate electrode 24 is formed between the source electrode and the drain electrode on the nitride semiconductor layer 18. The insulating film 26 is formed so as to cover the ohmic electrodes 20 and the gate electrode 24.

The opening 52 is formed in the insulating film 26 on the ohmic electrode 20. The wiring layer 30 is formed on the ohmic electrode 20 through the opening 52. The distance L2 between the edge portion of the insulating film 26 and the edge portion of the wiring layer 30 in the opening 52 is less than or equal to 1 μm.

A visual examination was conducted in the FETs to which the first embodiment and the first comparative example are applied. In the first embodiment and the first comparative example, the Ta film 21 was formed to have a film thickness of 10 nm, the Al film 22 was formed to have a film thickness of 280 nm, the metal film 23 was a Ta film with a film thickness of 10 nm, and the insulating film 26 was a silicon nitride film with a film thickness of 50 nm. The heat treatment temperature to alloy the ohmic electrode 20 was set to 550° C. The insulating film 36 was a silicon nitride film with a film thickness of 500 nm, and the film formation temperature was set to 300° C. The distance L2 of the first embodiment was 0.6 μm, and the distance L1 of the first comparative example was 1.4 μm. Examined were 500 or more chips having 2 mm×5 mm in chip size. Hillocks were formed in 7.8% of chips in the first comparative example while hillock was not formed in 0% of chips in the first embodiment.

The first embodiment forms the wiring layer 30 so that the distance L2 across which the upper surface of the ohmic electrode 20 including the Al film 22 is exposed through the opening 52 of the insulating film 26 is less than or equal to 1 μm as illustrated in FIG. 3A. That is to say, the distance between the whole inner edge of the opening 52 and the edge portion of the wiring layer 30 is less than or equal to 1 μm. This enables to reduce the formation of the hillock 40 from the Al film 22 as explained in FIG. 10. An inorganic insulating film such as a silicon oxide film or a silicon oxide nitride film may be used as the insulating film 26 instead of the silicon nitride film. The insulating film 26 preferably has a film thickness greater than or equal to 10 nm and less than or equal to 200 nm to reduce hillock formation. The distance L2 is preferably less than or equal to 0.8 μm, and more preferably less than or equal to 0.5 μm. The distance L2 is preferably greater than or equal to 0.1 μm to secure the production margin.

As illustrated in FIG. 2B, the metal film 23 is formed on the Al film 22. When the opening 52 is formed, the opening 52 is formed in the insulating film 26 and the metal film 23. As described above, even though the metal film 23 to reduce hillock formation is formed on the Al film 22, the metal film 23 is removed when the opening 52 of the insulating film 26 is formed. This causes the hillock 40 to be easily formed. Thus, the width of the region 35 is made to be preferably less than or equal to 1 μm. To reduce hillock formation, the metal film 23 preferably includes at least one of Ta, Mo (molybdenum), Pd (tantalum), Ni, and Ti (titanium). For example, a Mo film, a Pd film, a Ni film, or a Ti film may be used instead of a Ta film. For example, the metal film 23 is made of at least one of Ta, Mo, Pd, Ni, and Ti. The metal film 23 preferably has a film thickness greater than or equal to 1 nm and less than or equal to 50 nm to reduce hillock formation.

As illustrated in FIG. 1B, when the ohmic electrode 20 is formed, the ohmic electrode 20 is heat treated at a temperature greater than or equal to 500° C. This forms the Al grain 42 with a size of approximately 1 μm in the ohmic electrode 20. To make the size of the grain 42 of Al approximately 1 μm, the heat treatment temperature is preferably greater than or equal to 520° C., and more preferably greater than or equal to 550° C. In addition, the heat treatment temperature is preferably less than or equal to 700° C., and more preferably less than or equal to 600° C.

Included is a process to heat treat the wiring layer 30 at a temperature greater than or equal to 250° C. after the wiring layer 30 is formed. This causes the hillock 40 of Al to be easily formed. The heat treatment temperature is preferably greater than or equal to 270° C., and more preferably greater than or equal to 300° C.

The insulating film 36 is formed so as to cover the ohmic electrode 20 and the wiring layer 30. This process causes the hillock 40 of Al to be easily formed. Hillock formation can be reduced by configuring the distance L2 to be less than or equal to 1 μm. An inorganic insulating film such as a silicon oxide film or a silicon oxide nitride film may be used as the insulating film 36 instead of a silicon nitride film.

In the first embodiment, the nitride semiconductor layer 18 may be a layer including at least one of a GaN layer, an InN layer, an AlN layer, an InGaN layer, an AlGaN layer, an InAlN layer, and an InAlGaN layer.

The present invention is not limited to the specifically disclosed embodiments and variations but may include other embodiments and variations without departing from the scope of the present invention.

What is claimed is:

1. A method of fabricating a semiconductor device, the method comprising:
   forming a metal layer containing Al;
   forming an insulating film on the metal layer;
   forming an opening pattern to the insulating film, the metal layer being exposed in the opening pattern; and
   forming a wiring layer in the opening pattern, a first portion being disposed between an edge of the wiring layer and an edge of the opening pattern, a width of the first portion being 1μm or less, and the metal layer being exposed in the first portion.

2. The method according to claim 1, further comprising:
   forming a cover layer made of one of Ta, Mo, Pd, Ni, and Ti on the metal layer,
   wherein the forming of the opening pattern includes removing the cover film while opening the insulating layer.

3. The method according to claim 1, further comprising:
   heat treating the metal layer at a temperature greater than or equal to 500° C. before the forming of the opening pattern in the insulating film.

4. The method according to claim 1, wherein
   the metal layer is an electrode located on a nitride semiconductor layer.

5. The method according to claim 3, wherein
   the heat treating of the metal layer is performed while an upper surface and a lower surface of the metal layer are covered by a film made of Ta.

6. The method according to claim 1, further comprising:
   forming a second insulating film covering the metal layer.

7. The method according to claim 6, wherein
   the second insulating film has a compression or tensile stress greater than or equal to $5 \times 10^9$ dyne/cm$^2$ and less than or equal to $5 \times 10^{10}$ dyne/cm$^2$.

8. A method of fabricating a semiconductor device, the method comprising:
   forming an electrode pattern including a first metal layer containing Al adjacent to a gate electrode;
   forming an insulating film on the electrode pattern;
   forming a resist layer on the insulating film and between the gate electrode and the electrode pattern, the resist layer having an opening formed directly above a part of the electrode pattern;

forming an opening pattern of the insulating film that exposes the first metal layer by removing the insulating film inside the opening of the resist layer;

forming a second metal layer on the exposed first metal layer and the resist layer;

forming a wiring layer including a pattern that exposes the first metal layer from an edge portion of the opening pattern inside the opening pattern by patterning the second metal layer; and removing the resist layer.

9. The method according to claim 8, wherein
a first portion is disposed between an edge of the wiring layer and an edge of the opening pattern, a width of the first portion is 1μm or less, and the first metal layer is exposed in the first portion.

10. The method according to claim 8, further comprising:
forming a cover film made of one of Ta, Mo, Pd, Ni, and Ti on the first metal layer;
wherein the forming of the opening pattern includes removing the cover film while opening the insulating film.

11. The method according to claim 8, further comprising:
heat treating the first metal layer at a temperature greater than or equal to 500° C. before the forming of the opening pattern in the insulating film.

12. The method according to claim 8, wherein
the first metal layer is an electrode located on a nitride semiconductor layer.

13. The method according to claim 11, wherein
the heat treating of the first metal layer is performed while an upper surface and a lower surface of the first metal layer are covered by a film made of Ta.

14. The method according to claim 8, wherein
forming a second insulating film covering the first metal layer.

15. The method according to claim 14, wherein
the second insulating film has a compression or tensile stress greater than or equal to $5\times10^9$ dyne/cm$^2$ and less than or equal to $5\times10^{10}$ dyne/cm$^2$.

* * * * *